United States Patent
Pan

[11] Patent Number: 5,897,364
[45] Date of Patent: Apr. 27, 1999

[54] METHOD OF FORMING N- AND P-CHANNEL TRANSISTORS WITH SHALLOW JUNCTIONS

[75] Inventor: Yang Pan, Singapore, Singapore

[73] Assignee: Chartered Semiconductor Manufacturing, Ltd., Singapore, Singapore

[21] Appl. No.: 08/668,711

[22] Filed: Jun. 24, 1996

[51] Int. Cl.[6] ................................................. H01L 21/70
[52] U.S. Cl. .......................... 438/563; 438/548; 438/230
[58] Field of Search ............................ 437/164; 438/563, 438/548

[56] References Cited

U.S. PATENT DOCUMENTS

| | | | |
|---|---|---|---|
| 5,116,778 | 5/1992 | Haskell et al. | 437/164 |
| 5,434,440 | 7/1995 | Yoshitomi et al. | 257/344 |
| 5,518,945 | 5/1996 | Bracchitta et al. | 437/164 |

FOREIGN PATENT DOCUMENTS

| | | | |
|---|---|---|---|
| 52-19082 | 2/1977 | Japan | 437/164 |
| 54-2677 | 1/1979 | Japan | 437/164 |
| 57-28361 | 2/1982 | Japan | 437/164 |
| 57-141966 | 9/1982 | Japan | 437/164 |
| 01-100973 | 4/1989 | Japan | 437/164 |
| 01-168056 | 7/1989 | Japan | 437/164 |
| 02-188914 | 7/1990 | Japan | 437/164 |

OTHER PUBLICATIONS

S. Wolf, "Silicon Processing for the VLSI Era—vol. 2", Lattice Press, Sunset Beach, CA, 1990, pp. 334–335, 337.

*Primary Examiner*—Olik Chaudhuri
*Assistant Examiner*—Daniel Mao
*Attorney, Agent, or Firm*—George O. Saile; Stephen B. Ackermann; Rosemary L.S. Pike

[57] ABSTRACT

A method for forming N- and P-channel transistors having shallow junctions in an integrated circuit device is described. A semiconductor substrate is provided having active regions separated from one another by isolation regions wherein there is a N-channel active region and a P-channel active region and wherein gate electrodes and associated lightly doped source and drain regions have been formed in each of the active regions. A layer of borosilicate glass is deposited overlying the semiconductor substrate. A photoresist mask is formed over the P-channel active region. The borosilicate glass layer is etched away where it is not covered by the photoresist mask thereby leaving the borosilicate glass layer only overlying the P-channel region. The photoresist mask is removed. A layer of phosphosilicate glass is deposited overlying the semiconductor substrate. The semiconductor substrate is heated whereby boron ions within the borosilicate glass layer are driven into the semiconductor substrate in the P-channel region to form heavily doped P-channel source and drain regions and whereby phosphorus ions within the phosphosilicate glass layer are driven into the semiconductor substrate in the N-channel region to form heavily doped N-channel source and drain regions. The phosphosilicate layer is planarized to complete the formation of N- and P-channel transistors in the fabrication of an integrated circuit device.

18 Claims, 4 Drawing Sheets

5,897,364

METHOD OF FORMING N- AND P-CHANNEL TRANSISTORS WITH SHALLOW JUNCTIONS

BACKGROUND OF THE INVENTION (1) Field of the Invention

The invention relates to the fabrication of integrated circuit devices, and more particularly, to a method of forming both N- and P-channel transistors with shallow junctions in the fabrication of integrated circuits.

(2) Description of the Prior Art

In the fabrication of integrated circuits, as N- and P-channel transistors continue to be scaled down, extremely shallow junctions are required to reduce short channel effects.

Phosphosilicate glass (PSG) and borosilicate glass (BSG) materials are discussed in the book, *Silicon Processing for the VLSI Era, Volume 2: Process Integration*, by Stanley Wolf, Lattice Press, Sunset Beach, Calif., c. 1990, pp. 198, 334–335, 337.

SUMMARY OF THE INVENTION

A principal object of the present invention is to provide an effective and very manufacturable method of forming N- and P-channel transistors having shallow junctions in the fabrication of an integrated circuit device.

A further object of the invention is to provide a method of forming N- and P-channel transistors having shallow junctions on the order of 300 to 1000 Angstroms.

In accordance with the objects of this invention a method for forming N- and P-channel transistors having shallow junctions in an integrated circuit device is achieved. A semiconductor substrate is provided having active regions separated from one another by isolation regions wherein there is a N-channel active region and a P-channel active region and wherein gate electrodes and associated lightly doped source and drain regions have been formed in each of the active regions. A layer of borosilicate glass is deposited overlying the semiconductor substrate. A photoresist mask is formed over the P-channel active region. The borosilicate glass layer is etched away where it is not covered by the photoresist mask thereby leaving the borosilicate glass layer only overlying the P-channel region. The photoresist mask is removed. A layer of phosphosilicate glass is deposited overlying the semiconductor substrate. The semiconductor substrate is heated whereby boron ions within the borosilicate glass layer are driven into the semiconductor substrate in the P-channel region to form heavily doped P-channel source and drain regions and whereby phosphorus ions within the phosphosilicate glass layer are driven into the semiconductor substrate in the N-channel region to form heavily doped N-channel source and drain regions. The phosphosilicate layer is planarized to complete the formation of N- and P-channel transistors in the fabrication of an integrated circuit device.

BRIEF DESCRIPTION OF THE DRAWINGS

In the accompanying drawings forming a material part of this description, there is shown.

DESCRIPTION OF THE PREFERRED EMBODIMENTS

Figure 1:
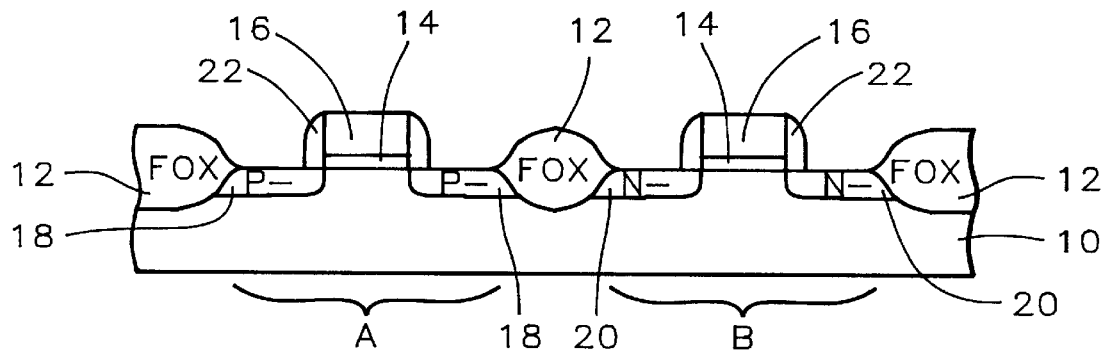
FIGS. 1 through 6 schematically illustrate in cross-sectional representation a first preferred embodiment of the present invention.

FIGS. 1 through 6 illustrate a first preferred embodiment of the present invention. Referring now more particularly to FIG. 1, there is shown an illustration of a portion of a partially completed integrated circuit. The semiconductor substrate 10 is preferably composed of silicon having a (100) crystallographic orientation. Field Oxide regions 12 are formed as are conventional in the art to separate active areas of the device. FIG. 1 shows the planned P-channel area A and the planned N-channel area B.

The surface of the silicon substrate 10 is thermally oxidized to form the gate oxide layer 14. A layer of polysilicon is deposited, for example, by low pressure chemical vapor deposition (LPCVD) to a suitable thickness of between about 2000 to 4000 Angstroms. The polysilicon and gate oxide layers are etched away where they are not covered by a mask to provide polysilicon gate electrodes 16.

Lightly doped source and drain regions are formed by ion implantation, as is conventional in the art. P– regions 18 are formed in the P-channel area A and N– regions 20 are formed in the N-channel area B.

A dielectric layer 22, comprising silicon dioxide or silicon nitride or the like is deposited over the gate electrodes and the surface of the substrate. The dielectric layer 22 is anisotropically etched to leave spacers on the sidewalls of the gate electrodes.

Figure 2:
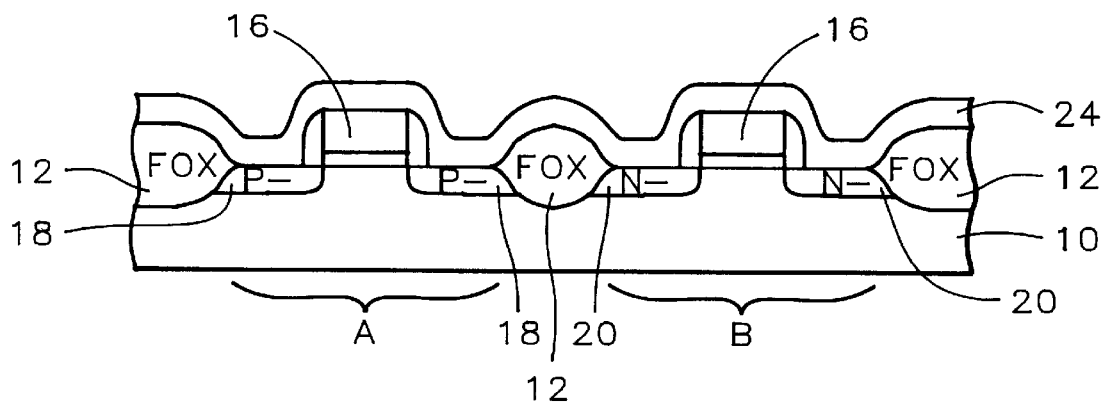

Now the shallow N- and P-channel junctions of the present invention will be formed. Referring now to FIG. 2, a layer of borosilicate glass (BSG) 24 is deposited over the surface of the substrate to a thickness of between about 1000 to 8000 Angstroms. The optimum percentage of boron in the BSG is between about 3 and 5%.

Figure 3:
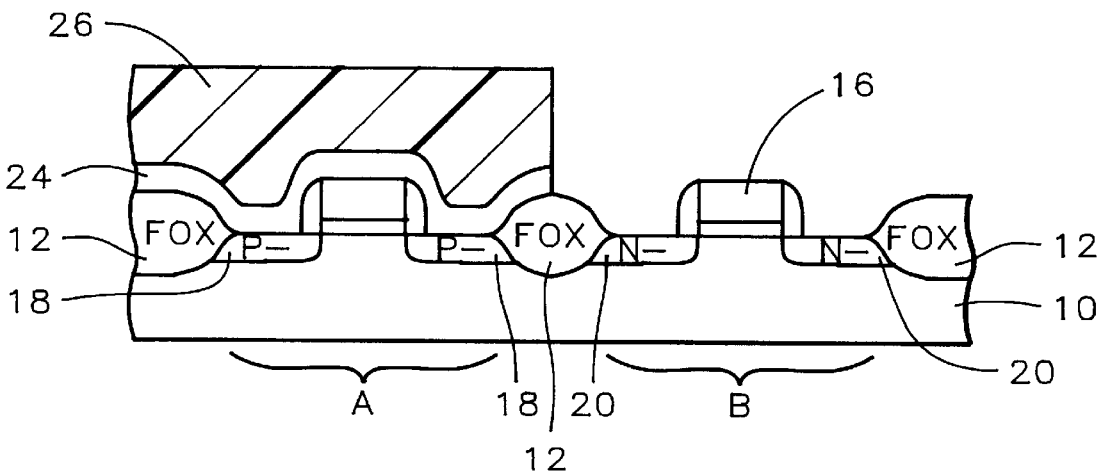

A photoresist mask 26 is formed over the P-channel area A. The BSG layer 24 is etched away where it is not covered by the mask 26, as shown in FIG. 3.

Figure 4:
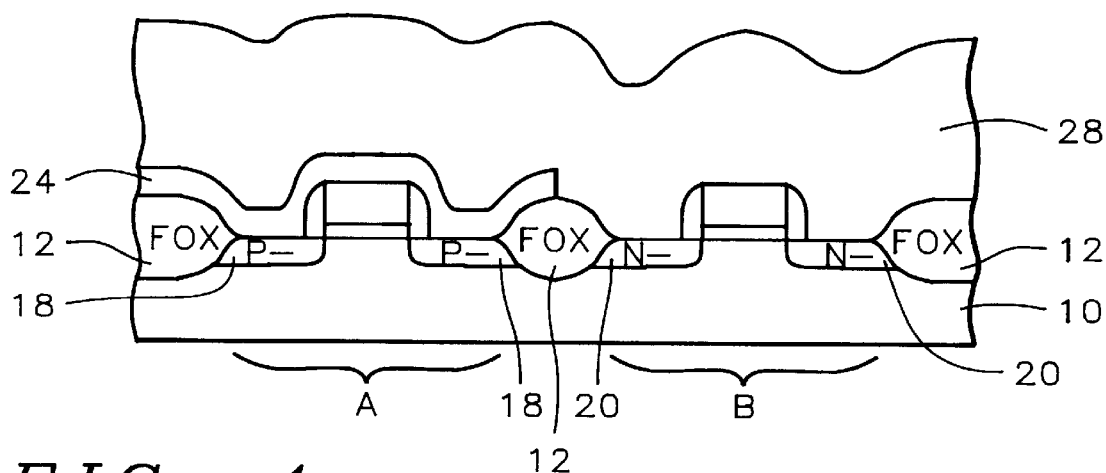

Referring now to FIG. 4, the photoresist mask 26 is removed. A layer of phosphosilicate glass (PSG) 28 is deposited over the surface of the substrate to a thickness of between about 3000 to 8000 Angstroms. The optimum percentage of phosphorus in the PSG is between about 3 and 5%.

At this point, the BSG layer 24 directly overlies the planned P-channel regions in area A. The PSG layer 28 directly overlies the planned N-channel regions in area B. A rapid thermal anneal (RTA) or a furnace anneal is performed to drive in the boron from the BSG layer and the phosphorus from the PSG layer into the substrate. The annealing conditions are conventional. For example, the furnace annealing may be at a temperature of between about 800 to 850° C. for between about 10 to 20 minutes. The RTA may be at a temperature of between about 900 to 1100° C. for between about 10 to 30 seconds.

Figure 5:
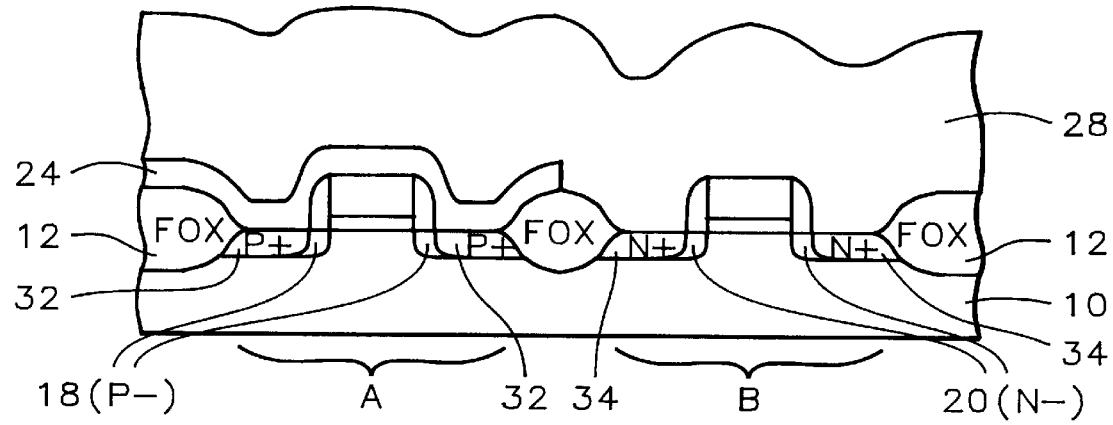

The boron is driven in to form the P+ regions 32, as shown in FIG. 5. The phosphorus is driven in to form the N+ regions 34. Depending upon the heat cycle and expected junction depth, the BSG layer 24 needs to be sufficiently thick to block the phosphorus from the overlying layer 28 from being diffused into the P-channel region A.

Figure 6:
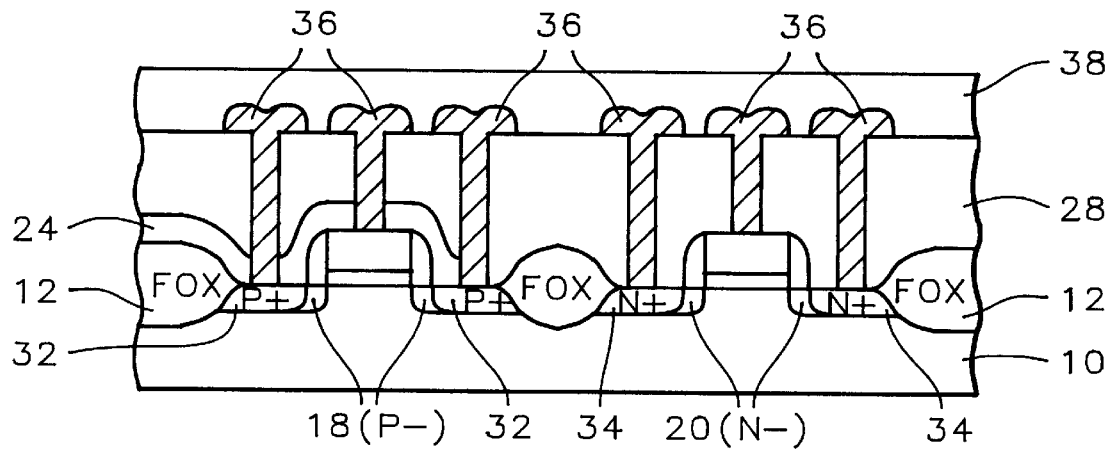

The integrated circuit device is completed as is conventional in the art. For example, as illustrated in FIG. 6, the PSG layer 28 is planarized, for example, by chemical mechanical polishing (CMP) or by other techniques such as reflow.

Openings are etched through the PSG layer 28 to underlying source and drain regions and other areas where electrical contact is to be made. A conducting layer 36 is deposited and patterned to complete the electrical connections. A passivation layer 38 completes the fabrication of the integrated circuit device.

Figure 7:
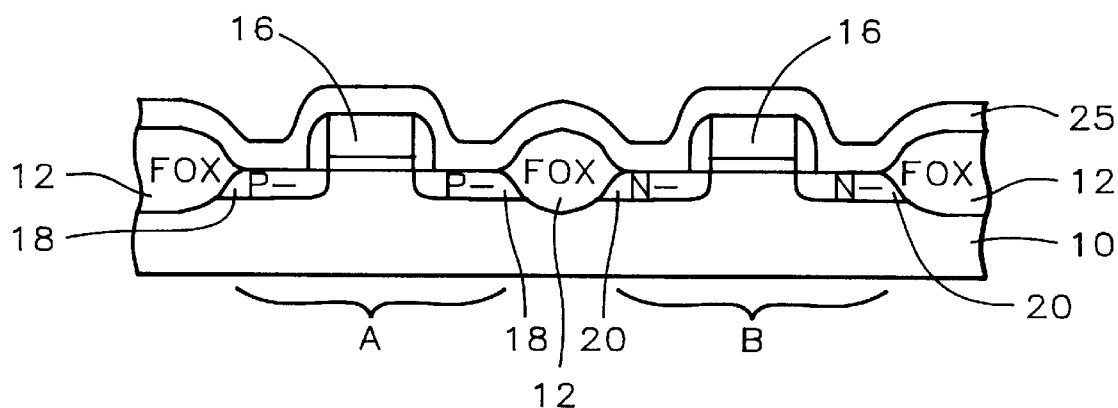
FIGS. 7 through 11 schematically illustrate in cross-sectional representation a second preferred embodiment of the present invention.

FIGS. 7 through 11 illustrate a second preferred embodiment of the present invention. Gate electrodes and lightly doped source and drain regions are formed as described above with reference to FIG. 1. FIG. 7 follows FIG. 1 in this embodiment. A layer of phosphosilicate glass (PSG) 25 is deposited over the surface of the substrate to a thickness of between about 1000 to 8000 Angstroms. The optimum percentage of phosphorus in the PSG is between about 3 and 5%.

Figure 8:
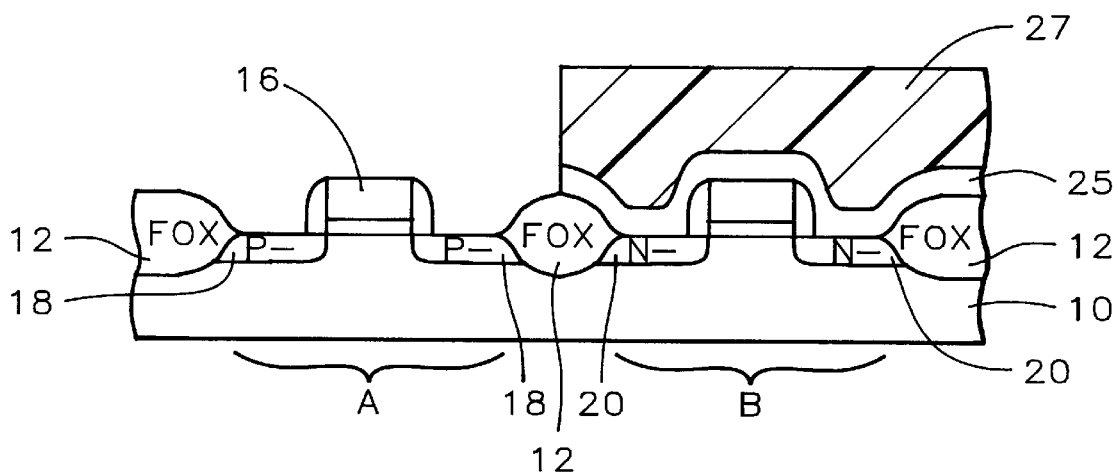

A photoresist mask 27 is formed over the N-channel area B. The PSG layer 25 is etched away where it is not covered by the mask 27, as shown in FIG. 8.

Figure 9:
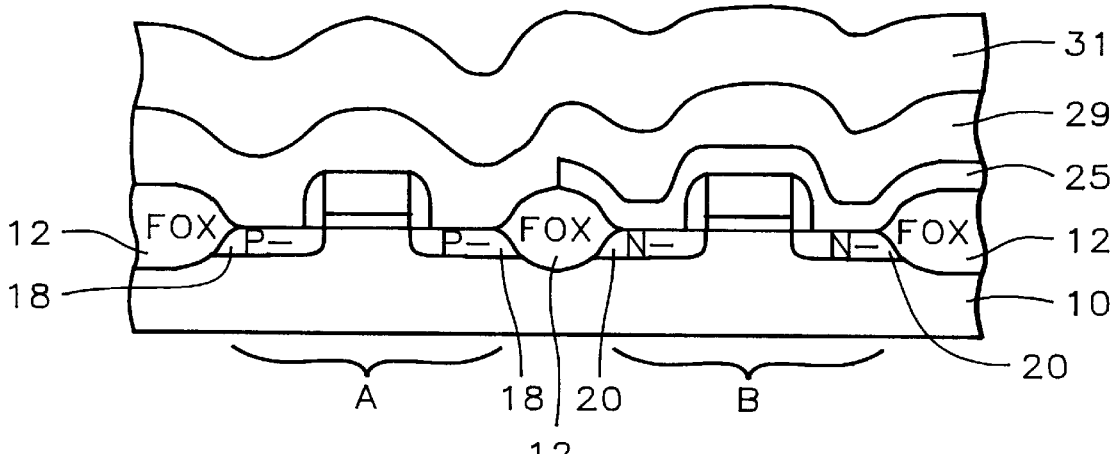

Referring now to FIG. 9, the photoresist mask 27 is removed. A layer of borosilicate glass (BSG) 29 is deposited over the surface of the substrate to a thickness of between about 3000 to 8000 Angstroms. The optimum percentage of boron in the BSG is between about 3 and 5%.

A second layer of phosphosilicate glass (PSG) 31 is deposited over the BSG layer 29 to a thickness of between about 2000 to 4000 Angstroms. This PSG layer 31 serves as the gettering layer. That is, the PSG traps contaminating sodium ions within it thereby preventing damage to the underlying gate oxide. In the first embodiment, the PSG layer 28 is the top layer and therefore acts as the gettering layer also.

At this point, the PSG layer 25 directly overlies the planned N-channel regions in area B. The BSG layer 29 directly overlies the planned P-channel regions in area A. A rapid thermal anneal (RTA) or a furnace anneal is performed to drive in the boron from the BSG layer and the phosphorus from the PSG layer into the substrate.

Figure 10:
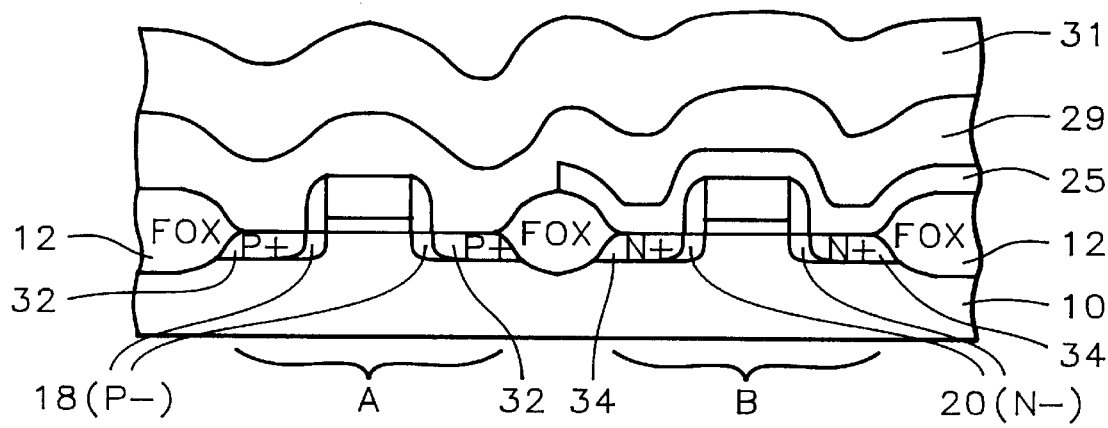

The boron is driven in to form the P+ regions 32, as shown in FIG. 10. The phosphorus is driven in to form the N+ regions 34. The PSG layer is sufficiently thick so that the phosphorus from the BSG layer overlying the PSG layer does not diffuse into the substrate.

Figure 11:
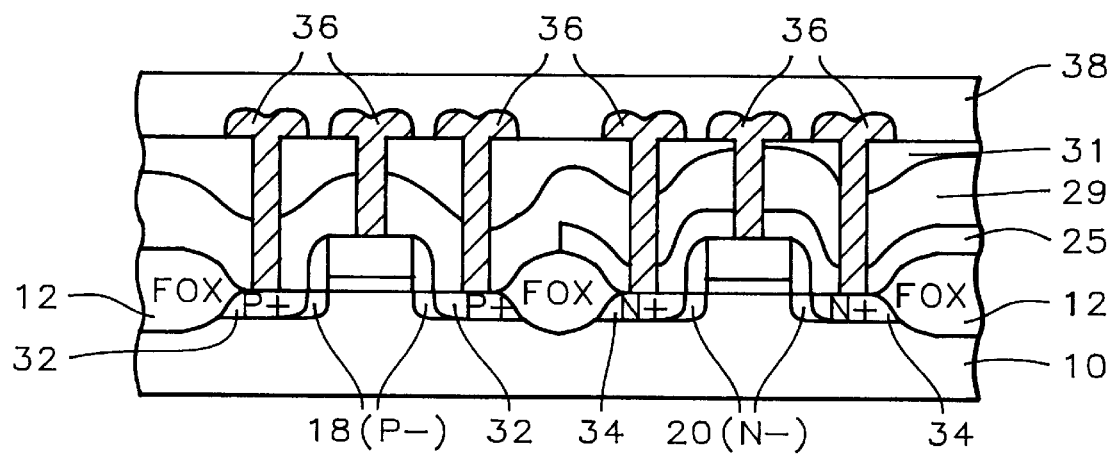

The integrated circuit device is completed as is conventional in the art. For example, as illustrated in FIG. 11, the PSG layer 31 is planarized, for example, by chemical mechanical polishing (CMP) or other techniques such as reflow. Openings are etched through the PSG layer 31 and BSG layer 29 to underlying source and drain regions and other areas where electrical contact is to be made. A conducting layer 36 is deposited and patterned to complete the electrical connections. A passivation layer 38 completes the fabrication of the integrated circuit device.

The process of the invention provides extremely shallow junctions having a depth of between about 300 to 1000 Angstroms, as compared to the conventional junction depth of between about 1500 to 3000 Angstroms. Only one masking step is required and ion implantation is avoided. The process of the invention is time and cost saving and is effective in providing extremely shallow junctions.

While the invention has been particularly shown and described with reference to the preferred. embodiments thereof, it will be understood by those skilled in the art that various changes in form and details may be made without departing from the spirit and scope of the invention.

What is claimed is:

1. A method of forming N- and P-channel transistors in the fabrication of an integrated circuit device comprising:

providing a semiconductor substrate having active regions separated from one another by isolation regions wherein there is a N-channel active region and a P-channel active region and wherein gate electrodes and associated lightly doped source and drain regions have been formed in each of said active regions;

depositing a layer of borosilicate glass overlying said semiconductor substrate and said gate electrodes;

forming a photoresist mask over said P-channel active region;

etching away said borosilicate glass layer where it is not covered by said photoresist mask thereby leaving said borosilicate glass layer only overlying said P-channel active region;

removing said photoresist mask;

thereafter depositing a layer of phosphosilicate glass overlying said semiconductor substrate, said gate electrodes, and said borosilicate glass layer;

thereafter heating said semiconductor substrate whereby boron ions within said borosilicate glass layer are driven into said semiconductor substrate adjacent to said gate electrodes in said P-channel active region to form heavily doped P-channel source and drain regions and whereby simultaneously phosphorus ions within said phosphosilicate glass layer are driven into said semiconductor substrate adjacent to said gate electrodes in said N-channel active region to form heavily doped N-channel source and drain regions; and planarizing said phosphosilicate glass layer to complete the formation of N- and P-channel transistors in the fabrication of an integrated circuit device.

2. The method according to claim 1 wherein said borosilicate glass layer has a thickness of between about 1000 to 8000 Angstroms.

3. The method according to claim 1 wherein said phosphosilicate glass layer has a thickness of between about 3000 to 8000 Angstroms.

4. The method according to claim 1 wherein said heating is a furnace annealing at a temperature of between about 800 to 850° C. for between about 10 to 20 minutes.

5. The method according to claim 1 wherein said heating is a rapid thermal annealing at a temperature of between about 900 to 1100° C. for between about 10 to 30 seconds.

6. The method according to claim 1 wherein said heavily doped source and drain regions have a junction depth of between about 300 to 1000 Angstroms.

7. A method of forming N- and P-channel transistors in the fabrication of an integrated circuit device comprising:

providing a semiconductor substrate having active regions separated from one another by isolation regions wherein there is a N-channel active region and a P-channel active region and wherein gate electrodes and associated lightly doped source and drain regions have been formed in each of said active regions;

depositing a first layer of phosphosilicate glass overlying said semiconductor substrate and said gate electrodes;

forming a photoresist mask over said N-channel active region;

etching away said first phosphosilicate glass layer where it is not covered by said photoresist mask thereby leaving said first phosphosilicate glass layer only overlying said N-channel active region;

removing said photoresist mask;

thereafter depositing a layer of borosilicate glass overlying said semiconductor substrate, said gate electrodes, and said phosphosilicate glass layer;

thereafter depositing a second layer of phosphosilicate glass overlying said borosilicate glass layer;

heating said semiconductor substrate whereby boron ions within said borosilicate glass layer are driven into said semiconductor substrate adjacent to said gate electrodes in said P-channel active region to form heavily doped P-channel source and drain regions and whereby simultaneously phosphorus ions within said first phosphosilicate glass layer are driven into said semiconductor substrate adjacent to said gate electrodes in said N-channel active region to form heavily doped N-channel source and drain regions; and planarizing said second phosphosilicate glass layer to complete the formation of N- and P-channel transistors in the fabrication of an integrated circuit device.

8. The method according to claim 7 wherein said first phosphosilicate glass layer has a thickness of between about 1000 to 8000 Angstroms.

9. The method according to claim 7 wherein said borosilicate glass layer has a thickness of between about 3000 to 8000 Angstroms.

10. The method according to claim 7 wherein said second phosphosilicate glass layer has a thickness of between 2000 to 4000 Angstroms.

11. The method according to claim 7 wherein said heating is furnace annealing at a temperature of between about 800 to 850° C. for between about 10 to 20 minutes.

12. The method according to claim 7 wherein said heating rapid thermal annealing at a temperature of between about 900 to 1100° C. for between about 10 to 30 seconds.

13. The method according to claim 7 wherein said heavily doped source and drain regions have a junction depth of between about 300 to 1000 Angstroms.

14. A method of forming N- and P-channel transistors in the fabrication of an integrated circuit device comprising:

providing a semiconductor substrate having active regions separated from one another by isolation regions wherein there is a N-channel active region and a P-channel active region;

forming gate electrodes and associated lightly doped source and drain regions in each of said active regions;

depositing a layer of borosilicate glass overlying said semiconductor substrate and said gate electrodes;

forming a photoresist mask over said P-channel active region;

etching away said borosilicate glass layer where it is not covered by said photoresist mask thereby leaving said borosilicate glass layer only overlying said P-channel active region;

removing said photoresist mask;

thereafter depositing a layer of phosphosilicate glass overlying said semiconductor substrate, said gate electrodes, and said borosilicate glass layer;

thereafter heating said semiconductor substrate whereby boron ions within said borosilicate glass layer are driven into said semiconductor substrate adjacent to said gate electrodes in said P-channel active region to form heavily doped P-channel source and drain regions and whereby simultaneously phosphorus ions within said phosphosilicate glass layer are driven into said semiconductor substrate adjacent to said gate electrodes in said N-channel active region to form heavily doped N-channel source and drain regions wherein the junction depth of said N-channel and said P-channel heavily doped source and drain regions is between about 300 and 1000 Angstroms; and planarizing said phosphosilicate glass layer to complete the formation of N- and P-channel transistors in the fabrication of an integrated circuit device.

15. The method according to claim 14 wherein said borosilicate glass layer has a thickness of between about 1000 to 8000 Angstroms.

16. The method according to claim 14 wherein said phosphosilicate glass layer has a thickness of between about 3000 to 8000 Angstroms.

17. The method according to claim 14 wherein said heating is a furnace annealing at a temperature of between about 800 to 850° C. for between about 10 to 20 minutes.

18. The method according to claim 14 wherein said heating is a rapid thermal annealing at a temperature of between about 900 to 1100° C. for between about 10 to 30 seconds.

* * * * *